(12) United States Patent
Cheng et al.

(10) Patent No.: US 12,040,221 B2
(45) Date of Patent: Jul. 16, 2024

(54) FABRICATION METHOD OF METAL-FREE SOI WAFER

(71) Applicant: Taiwan Semiconductor Manufacturing Company, Ltd., Hsin-Chu (TW)

(72) Inventors: Yu-Hung Cheng, Tainan (TW); Pu-Fang Chen, Hsinchu (TW); Cheng-Ta Wu, Shueishang Township (TW); Po-Jung Chiang, Zhongli (TW); Ru-Liang Lee, Hsinchu (TW); Victor Y. Lu, Foster City, CA (US); Yen-Hsiu Chen, Tainan (TW); Yeur-Luen Tu, Taichung (TW); Yu-Lung Yeh, Kaohsiung (TW); Shi-Chieh Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 25 days.

(21) Appl. No.: 17/579,088

(22) Filed: Jan. 19, 2022

(65) Prior Publication Data

US 2022/0139769 A1    May 5, 2022

Related U.S. Application Data

(62) Division of application No. 16/546,798, filed on Aug. 21, 2019, now Pat. No. 11,232,974.

(Continued)

(51) Int. Cl.
*H01L 21/762*    (2006.01)
*H01L 21/02*    (2006.01)
(Continued)

(52) U.S. Cl.
CPC .. *H01L 21/76254* (2013.01); *H01L 21/02532* (2013.01); *H01L 21/324* (2013.01); *H01L 21/84* (2013.01); *H01L 21/26506* (2013.01)

(58) Field of Classification Search
CPC .......... H01L 21/76254; H01L 21/3226; H01L 21/3221; H01L 21/76259; H01L 27/1203;
(Continued)

(56) References Cited

U.S. PATENT DOCUMENTS 5,492,859 A    2/1996   Sakaguchi et al.
5,494,849 A  * 2/1996   Lyer .................... H01L 21/3226
                                                        257/E21.32
(Continued)

FOREIGN PATENT DOCUMENTS

JP      H02278766 A    11/1990
JP      2000031439 A    1/2000
(Continued)

OTHER PUBLICATIONS

Stolk et al. "The Mechanism of Iron Gettering in Boron-Doped Silicon." Appl. Phys. Lett. 68, 51 (1996); doi: 10.1063/1.116754 Published Jan. 1, 1996.

(Continued)

*Primary Examiner* — Michael M Trinh
(74) *Attorney, Agent, or Firm* — Eschweiler & Potashnik, LLC

(57) ABSTRACT

Various embodiments of the present application are directed to a method for forming a semiconductor-on-insulator (SOI) device with an impurity competing layer to absorb potential contamination metal particles during an annealing process, and the SOI structure thereof. In some embodiments, an impurity competing layer is formed on the dummy substrate. An insulation layer is formed over a support substrate. A front side of the dummy wafer is bonded to the insulation (Continued)

layer. An annealing process is performed and the impurity competing layer absorbs metal from an upper portion of the dummy substrate. Then, a majority portion of the dummy substrate is removed including the impurity competing layer, leaving a device layer of the dummy substrate on the insulation layer.

20 Claims, 13 Drawing Sheets

Related U.S. Application Data

(60) Provisional application No. 62/773,304, filed on Nov. 30, 2018.

(51) Int. Cl.
 _H01L 21/324_ (2006.01)
 _H01L 21/84_ (2006.01)
 _H01L 21/265_ (2006.01)

(58) Field of Classification Search
 CPC ... H01L 27/1266; H01L 21/84; H01L 21/324; H01L 21/02532; H01L 21/26506
 See application file for complete search history.

(56) References Cited

U.S. PATENT DOCUMENTS

| | | | |
|---|---|---|---|
| 5,876,497 A | 3/1999 | Atoji | |
| 5,937,312 A | 8/1999 | Iyer et al. | |
| 6,455,398 B1 | 9/2002 | Fonstad, Jr. et al. | |
| 7,202,124 B2 * | 4/2007 | Fitzgerald | H01L 21/3226 257/E21.32 |
| 2005/0239267 A1 | 10/2005 | Tobashi | |
| 2007/0161199 A1 * | 7/2007 | Morita | H01L 21/26506 438/149 |
| 2007/0212852 A1 | 9/2007 | Tauzin et al. | |
| 2008/0020541 A1 | 1/2008 | Ikeda et al. | |
| 2009/0092810 A1 | 4/2009 | Lee et al. | |
| 2009/0117708 A1 | 5/2009 | Nishihata et al. | |
| 2009/0246936 A1 | 10/2009 | Yamazaki et al. | |
| 2009/0258475 A1 * | 10/2009 | Endo | H01L 21/30625 438/459 |
| 2010/0001322 A1 * | 1/2010 | Euen | H01L 29/66772 257/213 |
| 2010/0090303 A1 * | 4/2010 | Takizawa | H01L 21/3226 257/E31.127 |
| 2012/0138238 A1 * | 6/2012 | Tauzin | H01L 21/76254 156/711 |
| 2013/0102126 A1 * | 4/2013 | Aga | H01L 21/302 438/458 |
| 2015/0303097 A1 | 10/2015 | Konishi et al. | |
| 2016/0071761 A1 | 3/2016 | Tobisaka et al. | |

FOREIGN PATENT DOCUMENTS

| | | |
|---|---|---|
| KR | 20090108557 A | 10/2009 |
| TW | 201606878 A | 2/2016 |
| WO | 0154178 A1 | 1/2000 |

OTHER PUBLICATIONS

Chavva et al. "Dark Current Reduction in Image Sensors Through Metals Gettering : A Critical Review of Disruptive Techniques." 2013 International Image Sensor Workshop. Published Jun. 13, 2013.

Kang et al. "Gettering in Silicon." Journal of Applied Physics 65, 2974 (1989); https://doi.org/10.1063/1.342714 Published Apr. 15, 1989.

Isomae et al. "Intrinsic Gettering of Copper in Silicon Wafers." Journal of The Electrochemical Society, 149 (6) G343-G347 (2002), published on Apr. 25, 2002.

Myers et al. "Mechanisms of Transition-Metal Gettering in Silicon." Non-Final Office Action dated Nov. 25, 2020 for U.S. Appl. No. 16/546,798.

Final Office Action dated Jun. 8, 2021 for U.S. Appl. No. 16/546,798.
Notice of Allowance dated Sep. 20, 2021 for U.S. Appl. No. 16/546,798.

\* cited by examiner

FABRICATION METHOD OF METAL-FREE SOI WAFER

REFERENCE TO RELATED APPLICATIONS

This application is a Divisional of U.S. application Ser. No. 16/546,798, filed on Aug. 21, 2019, which claims the benefit of U.S. Provisional Application No. 62/773,304, filed on Nov. 30, 2018. The contents of the above-referenced Patent Applications are hereby incorporated by reference in their entirety.

BACKGROUND

Silicon on insulator (SOI) technology uses of a layered silicon-insulator-substrate in place of conventional silicon substrates in semiconductor manufacturing. SOI-based devices are fabricated above an electrical insulator, and the benefits include lower parasitic device, diminished short channel effects, reduced temperature dependency, lower leakage currents etc. in microelectronics devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
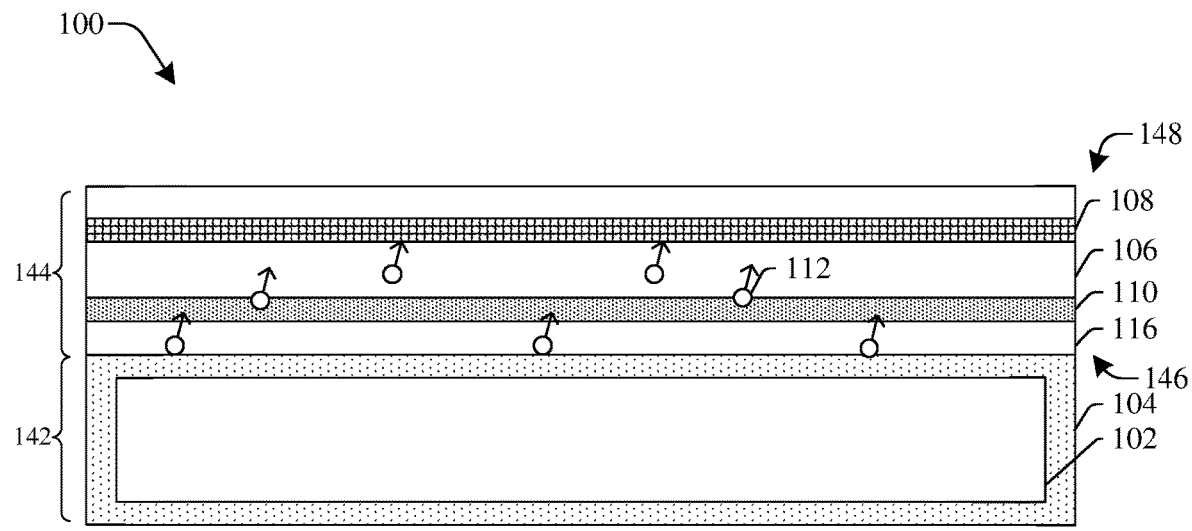
FIG. 1 is a cross-section view showing a SOI structure with an impurity competing layer in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

As an example, the preparation of a SOI structure may include following steps. First, a main wafer (may also be called carrier wafer in this disclosure) is provided. The carrier wafer may include a buried oxide layer disposed over a support substrate. Also, a dummy wafer is prepared. The dummy wafer includes a silicon layer disposed on a dummy substrate. Then, the main wafer and the dummy wafer are bonded together. The bonded wafers are then subject to a splitting process to remove the dummy substrate and a portion of the silicon layer, leaving a top silicon layer formed on the buried oxide layer. The splitting process can be performed in several ways, such as polishing or smart-cut. High residual metal in a top silicon layer is a common concern of the SOI structure. For example, for a SOI structure fabricated by smart-cut process, due to hydrogen implantation, the implanted region would gather the potential metal contamination. The wafer-bonding process is another cause to gather metal contamination into a bonding interface between the buried oxide layer and the top silicon layer, and then result in high residual metal in the top silicon layer. The residual metal contaminants may include iron (Fe), molybdenum (Mo), titanium (Ti), copper (Cu), and nickel (Ni) and may segregate to wafer surface during the cool down process and result in surface defects.

In view of the above, some aspects of the present disclosure is related to a SOI structure and its fabrication method to mitigate metal contamination during a SOI structure fabrication process. The SOI fabrication process includes bonding a dummy wafer to a carrier wafer followed by a splitting process to form a top silicon layer on the carrier wafer. An additional impurity competing layer is formed on the dummy wafer as the metal gettering layer to reduce metal contamination of the SOI structure. As a result, the SOI structure and the semiconductor device formed thereof has eliminated or at least reduced metal contamination. The impurity competing layer may be removed after a final thinning process. In some embodiments, the impurity competing layer may also work as an etch-stop layer for a later removal process of the dummy wafer. As an example, the impurity competing layer may include an epitaxial p-type silicon layer with gettering sources such as germanium, boron, and carbon.

In some embodiments, the impurity competing layer may be implanted within the dummy wafer prior to the bonding process. The impurity competing layer may be formed on or within the dummy substrate of the dummy wafer. The substrate of the dummy wafer may include a high doped silicon substrate, such as p-type doped silicon with a doping concentration greater than $10^{17}$ cm$^{-3}$. The impurity competing layer may include implantations of carbon, boron, phosphorus, helium, or the combination of. Next, the dummy wafer is bonded to the carrier wafer followed by a bonding annealing process. During the bonding annealing process, the impurity competing layer absorbs metal from the top silicon layer. Then, the carrier wafer and the dummy wafer are separated. In the wafer separating step, both the impurity competing layer and the dummy substrate of the dummy wafer are removed.

In some alternative embodiments, instead of forming the impurity competing layer within the substrate, it can also be formed on back of the dummy wafer opposite to the top silicon layer. The impurity competing layer may be formed through a backside sandblasting process, a gettering dry polishing process to the dummy substrate, a deposition of a polysilicon film, a silicon oxynitride film, a silicon germanium film, or a silicon nitride film. Next, the dummy wafer is bonded to the carrier wafer followed by an annealing process. During the bonding annealing process, the impurity competing layer absorbs metal from the top silicon layer. Then, the wafers are separated. In the wafer separating step, both the impurity competing layer and the substrate of the dummy wafer are removed. Also, instead of using a smart-cut process, the carrier wafer and the dummy wafer can be separated by a non-smart process. An impurity competing layer can be formed either within or on back of the substrate of the dummy wafer, and is removed later together with the dummy substrate from the carrier wafer, leaving a top silicon layer on the carrier wafer with reduced metal contamination.

In some alternative embodiments, instead of forming an additional competing layer on a dummy substrate, the substrate of dummy wafer can be highly doped and function as a thick impurity competing body. A less doped epitaxial layer (e.g. a P-doped Epi layer) is deposited on the highly doped dummy substrate (e.g. P++, a doping concentration greater than $10^{17}$ cm$^{-3}$). During a bonding annealing process, the impurity competing body (P++ substrate) gathers the potential metal contamination. Then, the P++ dummy substrate and a portion of the P– Epi layer may be removed.

FIG. 1 shows a cross-section view 100 showing a SOI structure with an impurity competing layer 108 in accordance with some embodiments. The SOI structure may include a carrier wafer 142 having an insulation layer 104 disposed over a support substrate 102. In some embodiments, the support substrate 102 is or comprises monocrystalline silicon, some other silicon material, some other semiconductor material, glass, silicon dioxide, aluminium oxide, or any combination thereof. The support substrate 102 may have a circular top layout and/or has a diameter of about 200, 300, or 450 millimeters. The support substrate 102 may also have some other shape and/or some other dimensions. The support substrate 102 may have a high resistance and/or a low oxygen concentration. The high resistance and the low oxygen concentration individually reduce substrate and/or RF losses. The high resistance may, for example, be greater than about 1, 3, 4, or 9 kΩ/cm, and/or may, for example, be between about 1-4 kΩ/cm, about 4-9 kΩ/cm, or about 1-9 kΩ/cm. The low oxygen concentration may, for example, be less than about 1, 2, or 5 ppma, and/or may, for example, be between about 0.1-2.5 ppma, about 2.5-5.0 ppma, or about 0.1-5.0 ppma. In some embodiments, the support substrate 102 is doped with p-type or n-type dopants. In some embodiments, a thickness of the support substrate 102 is about 720-780 micrometers, about 720-750 micrometers, or about 750-780 micrometers. The insulation layer 104 can be, for example, silicon dioxide or sapphire. The insulation layer 104 may cover outer surfaces of the support substrate 102. In some embodiments, a thickness of the insulator layer 104 is about 0.2-2.0 micrometers, about 0.2-1.1 micrometers, or about 1.1-2.0 micrometers.

A dummy wafer 144 is bonded to the carrier wafer 142. The dummy wafer 144 includes a dummy substrate 106. In some embodiments, the dummy substrate 106 is or comprises monocrystalline silicon, some other silicon material, some other semiconductor material, or any combination of the foregoing. The dummy substrate 106 may have a circular top layout and/or has a diameter of about 200, 300, or 450 millimeters. The dummy substrate 106 may also have some other shape and/or some other dimensions. In some embodiments, the dummy substrate 106 is a bulk semiconductor substrate and/or is a semiconductor wafer. In some embodiments, a thickness of the dummy substrate 106 is about 720-780 micrometers, about 720-750 micrometers, or about 750-780 micrometers. In some embodiments, a hydrogen-rich region 110 is disposed at a position within the dummy substrate 106 from a front side 146 of the dummy wafer 144.

In some embodiments, an impurity competing layer 108 is disposed within the dummy substrate 106. The impurity competing layer 108 may be formed by an implantation process to an inner position of the dummy substrate 106 by a carbon implantation process, a boron implantation process, a phosphorous implantation process, a helium implantation process or the combination thereof. The impurity competing layer 108 is configured to absorb contamination metal particles 112 when thermal process is performed. During the thermal process, the impurity competing layer 108 absorbs the potential contamination particles 112 from an interface area between the carrier wafer 142 and the dummy wafer 144 towards the impurity competing layer 108, as illustrated by the arrows connected to the particles 112. Thus, the potential contamination particles 112 are removed from a top portion of the dummy substrate 106 close to the insulation layer 104. The thermal process may be integrated with a bonding annealing process and strengthen the bonding of the dummy wafer 144 and the carrier wafer 142. In some embodiments, the annealing process is performed at a temperature of about 300-1150° C., about 300-725° C., or about 735-1150° C. In some embodiments, the annealing process is performed for about 2-5 hours, about 2-3.5 hours, or about 3.5-5 hours. In some embodiments, the annealing process is performed with a pressure at about 1 atm, about 0.5-1.0 atm, about 1.0-1.5, or about 0.5-1.5 atm. In some embodiments, the annealing process is performed while nitrogen gas (e.g., N$_2$) and/or some other gas flows over the structure of FIG. 10. The flow rate for the gas may, for example, about 1-20 standard litre per minute (slm), about 1-10 slm, or about 10-20 slm.

The SOI structure shown in FIG. 1 is an intermediate structure for preparing an SOI substrate. After the thermal process, the dummy wafer 144 and the carrier wafer 142 are split along the hydrogen-rich region 110 to partially remove a portion of the dummy substrate 106 from the dummy wafer 144 and leave a top portion as a device layer 116 for the SOI substrate. A chemical mechanical polish (CMP) is performed into a portion of the dummy substrate 106 remaining on the carrier wafer 142 to flatten the remaining portion, and to clean up a residue portion 114 of the hydrogen-rich region 110. The remaining portion of the dummy substrate 106 defines the device layer 116 of the carrier wafer 142

Figure 2:
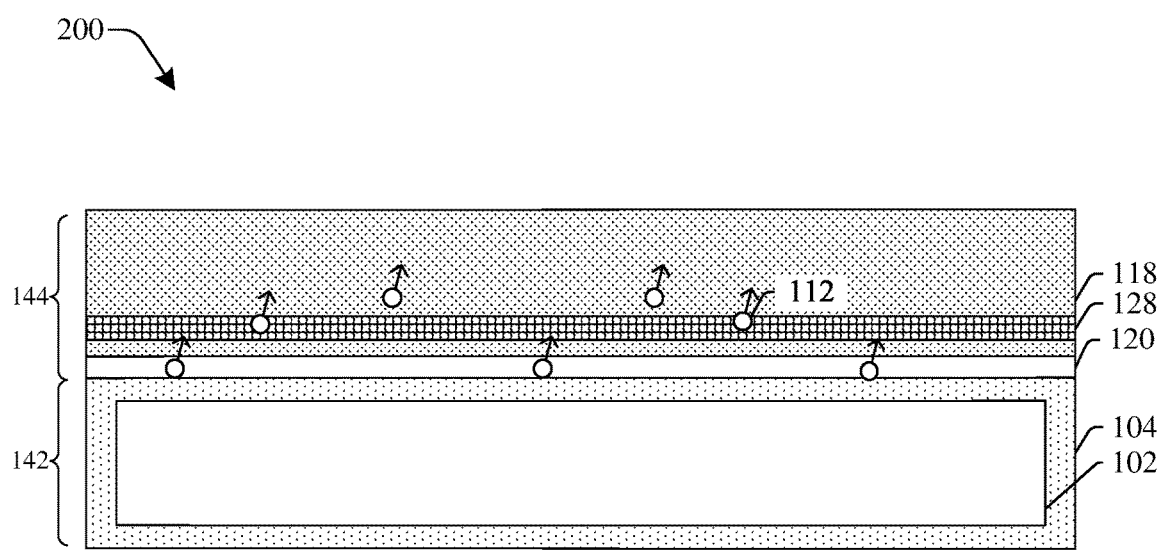
FIG. 2 is a cross-section view showing a SOI structure with an impurity competing layer in accordance with some alternative embodiments.

FIG. 2 shows a cross-section view 200 of a SOI structure with an impurity competing layer 128 in accordance with some alternative embodiments. The dummy substrate 118 of the dummy wafer 144 can be highly doped (e.g. P++, a doping concentration greater than $10^{17}$ cm$^{-3}$) and function as a thick impurity competing body absorbing contamination metal particles together with the impurity competing layer 128. In some embodiments, the dummy substrate 118 may have a low resistance which may, for example, be less than about 8, 10, or 12 Ω/cm, and/or may, for example, be about 8-12 Ω/cm, about 8-10 Ω/cm, or about 10-12 Ω/cm. The hydrogen-rich region 110 shown in FIG. 1 may be absent and the dummy wafer 144 can be removed by a thinning process. The thinning process removes a portion of the dummy wafer 144 which may include the whole dummy substrate 118 and a portion of the device layer 120. In some embodiments, the thinning process is performed into the dummy wafer 144 including the device layer 120 until leaving a top portion having a predetermined thickness. The predetermined thickness may, for example, about 20-45 micrometers, about 20-32.5 micrometers, or about 32.5-45 micrometers.

Figure 3:
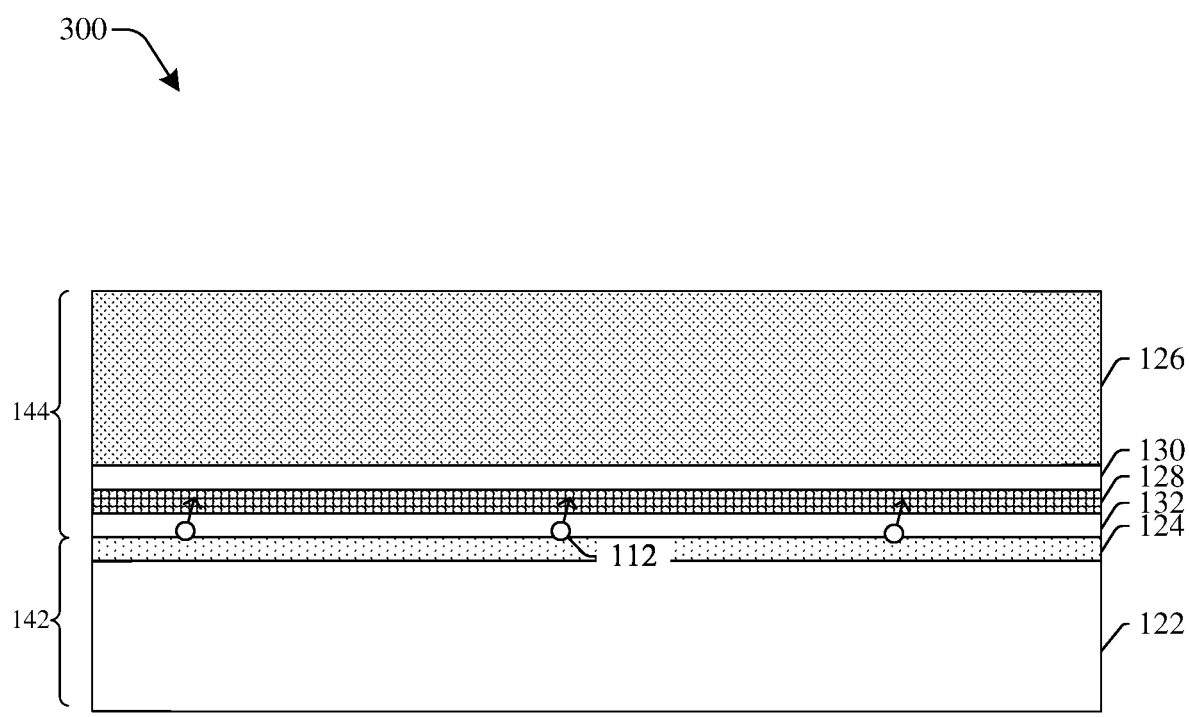
FIG. 3 is a cross-section view showing a SOI structure with an impurity competing layer in accordance with some alternative embodiments.

FIG. 3 is a cross-section view showing a SOI structure with an impurity competing layer in accordance with some alternative embodiments. Compared to FIG. 2, a less doped epitaxial layer 130 (e.g. a P-doped Epi layer) may be deposited on the highly doped dummy substrate 126. The impurity competing layer 128 may be formed at an inner position within the epitaxial layer 130. The thinning process is performed to remove the dummy substrate 126, the impurity competing layer 128, and a portion of the epitaxial layer 130 and leave a top portion 132 having a predetermined thickness. The predetermined thickness may, for example, about 20-45 micrometers, about 20-32.5 micrometers, or about 32.5-45 micrometers.

FIGS. 4-10 are cross-sectional views 400-1000 showing a method of manufacturing a SOI structure that uses an impurity competing layer for getting contamination particles in accordance with some embodiments.

Figure 4:
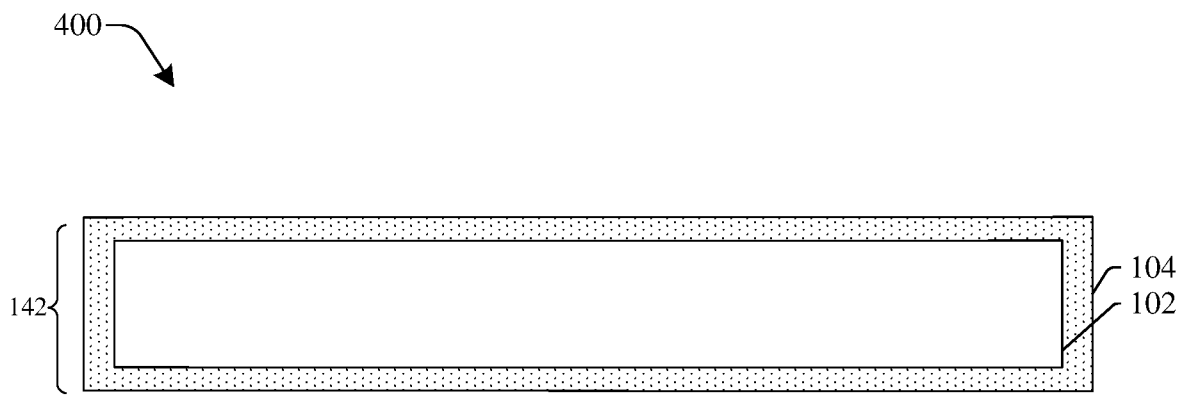
FIGS. 4-10, 11-12, 13-18, and 19-24 respectively illustrate a series of cross-sectional views of a SOI structure with an impurity competing layer at various stages of manufacture in accordance with some embodiments.

As shown in a cross-sectional view 400 of FIG. 4, a carrier wafer 142 is provided. The carrier wafer 142 includes a support substrate 102. An insulation layer 104 is formed on the support substrate 102. In some embodiments, the support substrate 102 is or comprises monocrystalline silicon, some other silicon material, some other semiconductor material, glass, silicon dioxide, aluminium oxide, or any combination thereof. In some embodiments, the support substrate 102 has a circular top layout and/or has a diameter of about 200, 300, or 450 millimeters. In other embodiments, the support substrate 102 has some other shape and/or some other dimensions. In some embodiments, the support substrate 102 has a high resistance and/or a low oxygen concentration. The high resistance and the low oxygen concentration individually reduce substrate and/or RF losses. The high resistance may, for example, be greater than about 1, 3, 4, or 9 kΩ/cm, and/or may, for example, be between about 1-4 kΩ/cm, about 4-9 kΩ/cm, or about 1-9 kΩ/cm. The low oxygen concentration may, for example, be less than about 1, 2, or 5 ppma, and/or may, for example, be between about 0.1-2.5 ppma, about 2.5-5.0 ppma, or about 0.1-5.0 ppma. In some embodiments, the support substrate 102 has a low resistance to reduce substrate costs since a high resistance substrate may, for example, be costlier than a low resistance substrate. The low resistance may, for example, be less than about 8, 10, or 12 Ω/cm, and/or may, for example, be about 8-12 Ω/cm, about 8-10 Ω/cm, or about 10-12 Ω/cm. In some embodiments, the support substrate 102 is doped with p-type or n-type dopants. The resistance of the support substrate 102 may, for example, be controlled by a doping concentration of the support substrate 102. In some embodiments, a thickness of the support substrate 102 is about 720-780 micrometers, about 720-750 micrometers, or about 750-780 micrometers. The insulation layer 104 can be, for example, silicon dioxide or sapphire. In some embodiments, the insulation layer 104 can be formed by performing a thermal process to the support substrate 102 to form a thermal oxide layer. In other embodiments, the insulation layer 104 can be formed by a deposition process, such as, a chemical vapor deposition process (CVD), a physical vapor deposition process (PVD), or an atomic layer deposition process (ALD). The insulation layer 104 may be formed covering outer surfaces of the support substrate 102. In some embodiments, a thickness of the insulator layer 104 is about 0.2-2.0 micrometers, about 0.2-1.1 micrometers, or about 1.1-2.0 micrometers.

Figure 5:
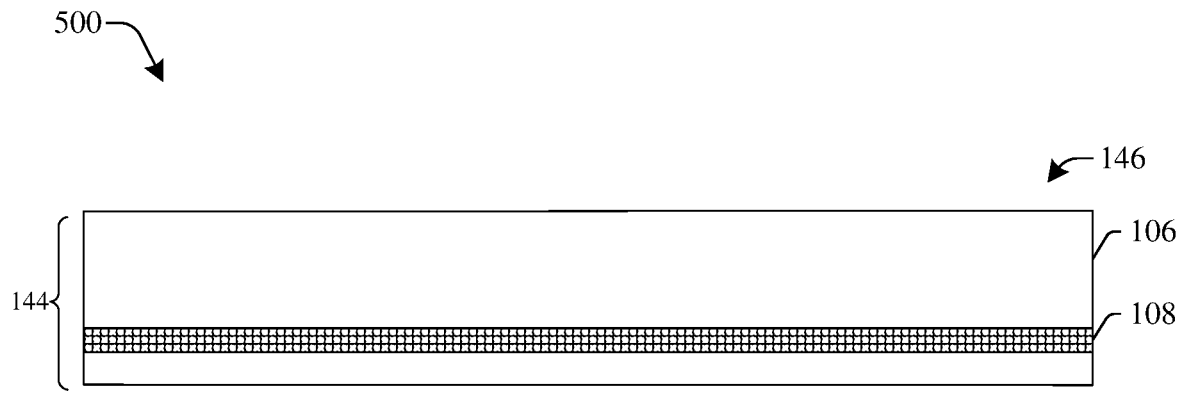

As shown in a cross-sectional view 500 of FIG. 5, a dummy wafer 144 is provided. The dummy wafer 144 includes a dummy substrate 106. In some embodiments, the dummy substrate 106 is or comprises monocrystalline silicon, some other silicon material, some other semiconductor material, or any combination of the foregoing. In some embodiments, the dummy substrate 106 is doped with p-type or n-type dopants and/or has a low resistivity. The low resistance may, for example, be less than about 0.01 or 0.02 Ω/cm and/or may, for example, be about 0.01-0.2 Ω/cm. In some embodiments, the dummy substrate 106 has a lower resistance than the support substrate 102. In some embodiments, the dummy substrate 106 has a circular top layout and/or has a diameter of about 200, 300, or 450 millimeters. In other embodiments, the dummy substrate 106 has some other shape and/or some other dimensions. In some embodiments, the dummy substrate 106 is a bulk semiconductor substrate and/or is a semiconductor wafer. In some embodiments, a thickness of the dummy substrate 106 is about 720-780 micrometers, about 720-750 micrometers, or about 750-780 micrometers. In some embodiments, the thickness of the dummy substrate 106 is the same or about the same as the thickness of the support substrate 102.

Also shown in the cross-sectional view 500 of FIG. 5, an impurity competing layer 108 is formed in the dummy substrate 106. In some embodiments, the impurity competing layer 108 may be formed by an implantation process to an inner position of the dummy substrate 106 by a carbon implantation process, a boron implantation process, a phosphorous implantation process, a helium implantation process or the combination thereof.

Figure 6:
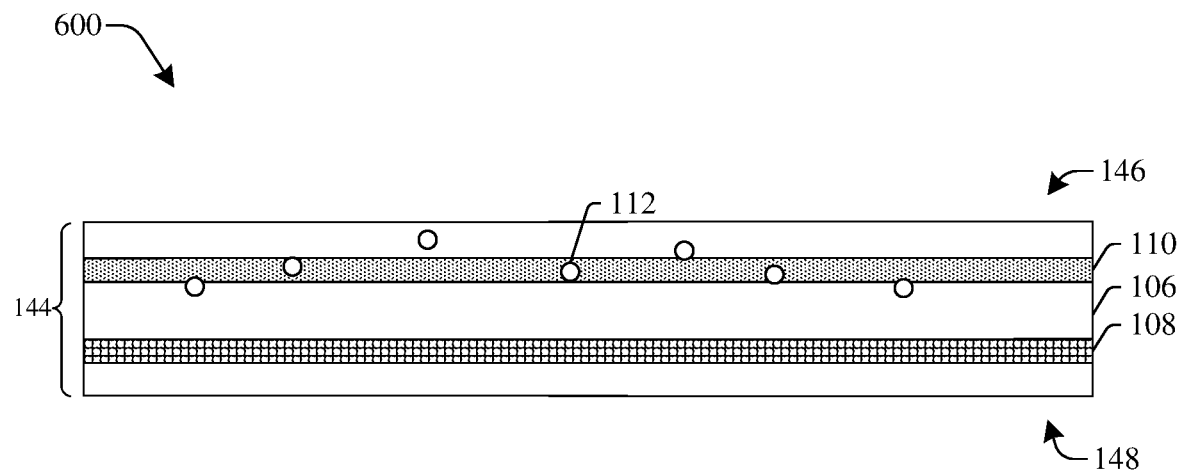

As shown in the cross-sectional view 600 of FIG. 6, in some embodiments, hydrogen ions are implanted into the dummy substrate 106 to form a hydrogen-rich region 110 buried in the dummy substrate 106. The hydrogen implantation process may be performed from a front side 146 of the dummy wafer 144 to form a hydrogen-rich region 110 at a position within the dummy substrate 106. The hydrogen implantation process may gather some potential metal contaminations (shown by particles 112 for illustration purposes) to the dummy wafer 144.

Figure 7:
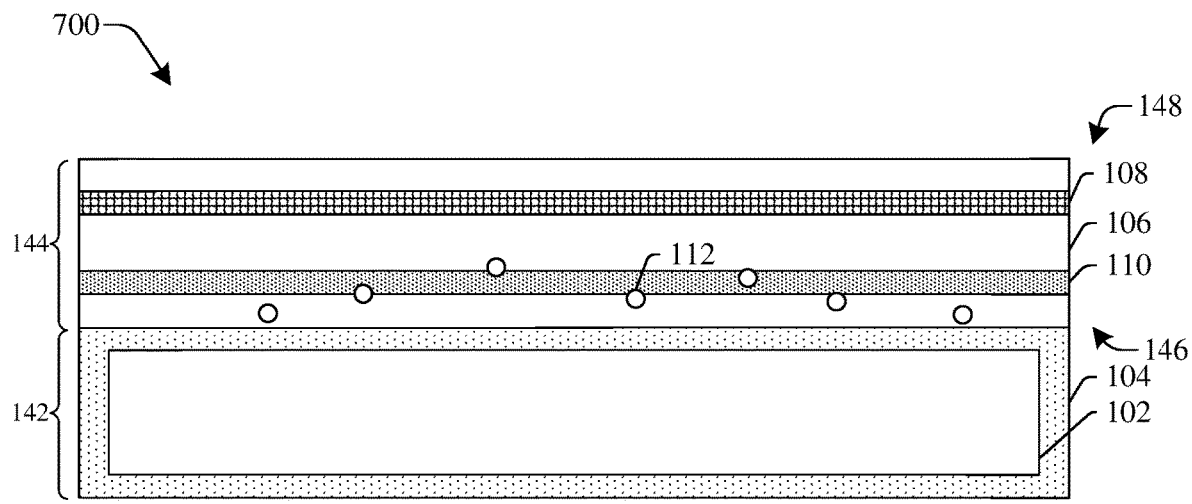

As shown in the cross-sectional view 700 of FIG. 7, the dummy wafer 144 is bonded to the carrier wafer 142 from a front side 146. The bonding presses the dummy wafer 144 and the carrier wafer 142 together and forms a bond interface at which the insulation layer 104 and a top portion of the carrier wafer 142 directly contact. The bonding may, for example, be performed by fusion bonding, vacuum bonding, or some other bonding process. The fusion bonding may, for example, be performed with a pressure at about 1 standard atmosphere (atm), about 0.5-1.0 atm, about 1.0-1.5, or about 0.5-1.5 atm. The vacuum bonding may, for example, be performed with a pressure at about 0.5-100 millibars (mBar), about 0.5-50 mBar, or about 50-100 mBar. The bonding process may also gather some potential metal contaminations (shown by particles 112 for illustration purposes) to an interface between the carrier wafer 142 and the dummy wafer 144.

Figure 8:
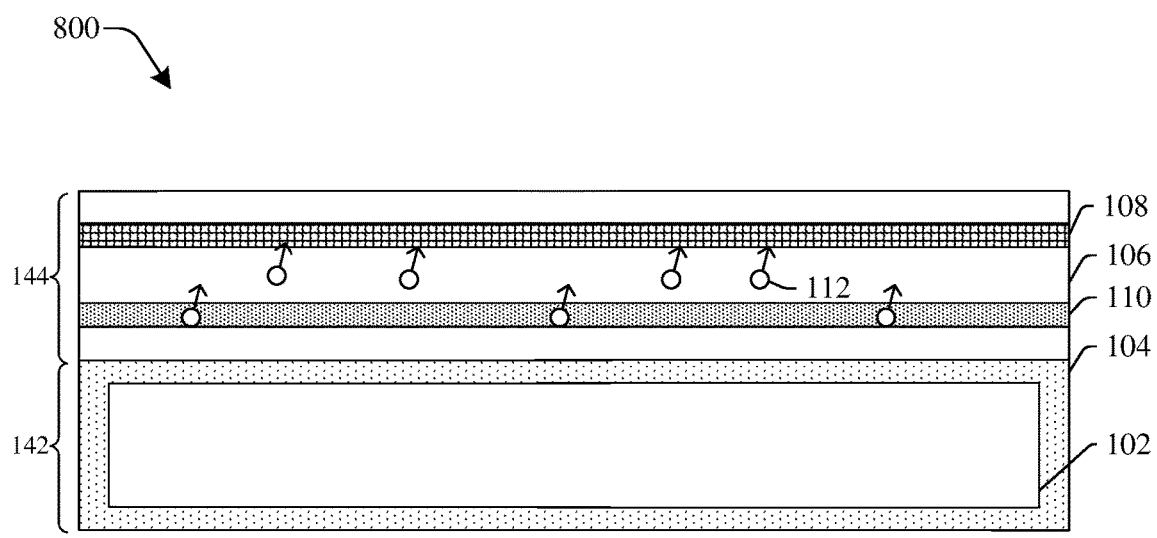

As shown in the cross-sectional view 800 of FIG. 8, an annealing process is performed. During the annealing process, the impurity competing layer 108 absorbs the potential contamination particles 112 from an interface area between the carrier wafer 142 and the dummy wafer 144 towards the impurity competing layer 108, as illustrated by the arrows connected to the particles 112. Thus, the potential contamination particles 112 are removed from a top portion of the dummy substrate 106 close to the insulation layer 104. The annealing process may be integrated with a bonding annealing process and strengthen the bonding of the dummy wafer 144 and the carrier wafer 142. The annealing process may also form connecting voids along the hydrogen-rich region 110 by promoting the formation and linkage of brittle silicon hydride. In some embodiments, the annealing process is performed at a temperature of about 300-1150° C., about 300-725° C., or about 735-1150° C. In some embodiments, the annealing process is performed for about 2-5 hours, about 2-3.5 hours, or about 3.5-5 hours. In some embodiments, the annealing process is performed with a pressure at about 1 atm, about 0.5-1.0 atm, about 1.0-1.5, or about 0.5-1.5 atm. In some embodiments, the annealing process is performed while nitrogen gas (e.g., $N_2$) and/or some other gas flows over the structure of FIG. 10. The flow rate for the gas may, for example, about 1-20 standard litre per minute (slm), about 1-10 slm, or about 10-20 slm.

Figure 9:
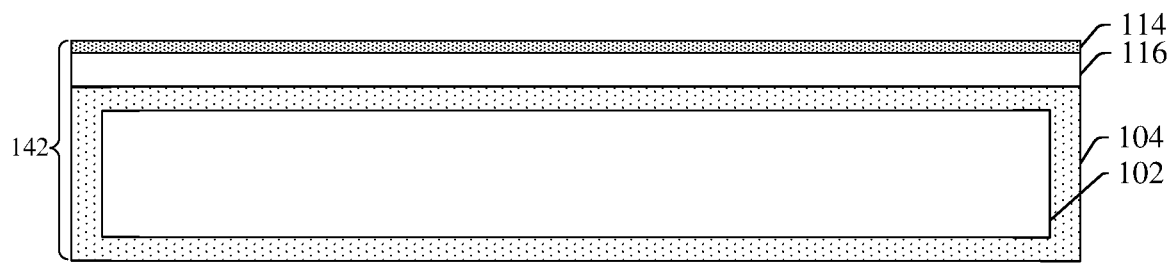

As shown in the cross-sectional view 900 of FIG. 9, the dummy wafer 144 and the carrier wafer 142 are fractured and separated along the voids of the hydrogen-rich region 110 to partially remove a portion of the dummy substrate 106 from the dummy wafer 144.

Figure 10:
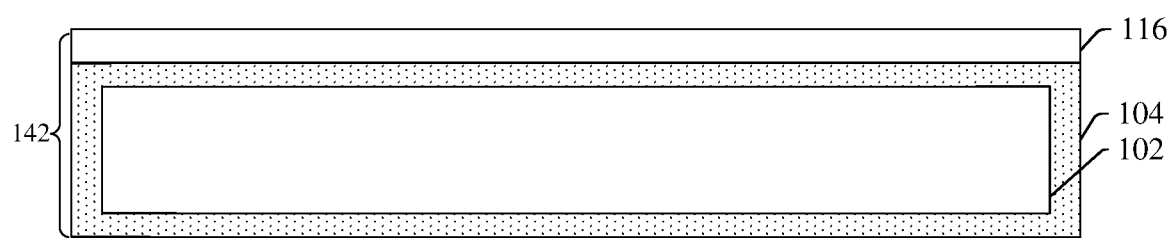

As shown in the cross-sectional view 1000 of FIG. 10, a chemical mechanical polish (CMP) is performed into a portion of the dummy substrate 106 remaining on the carrier wafer 142 to flatten the remaining portion, and to clean up a residue portion 114 of the hydrogen-rich region 110. The remaining portion of the dummy substrate 106 defines a device layer 116 of the carrier wafer 142.

Figure 11:
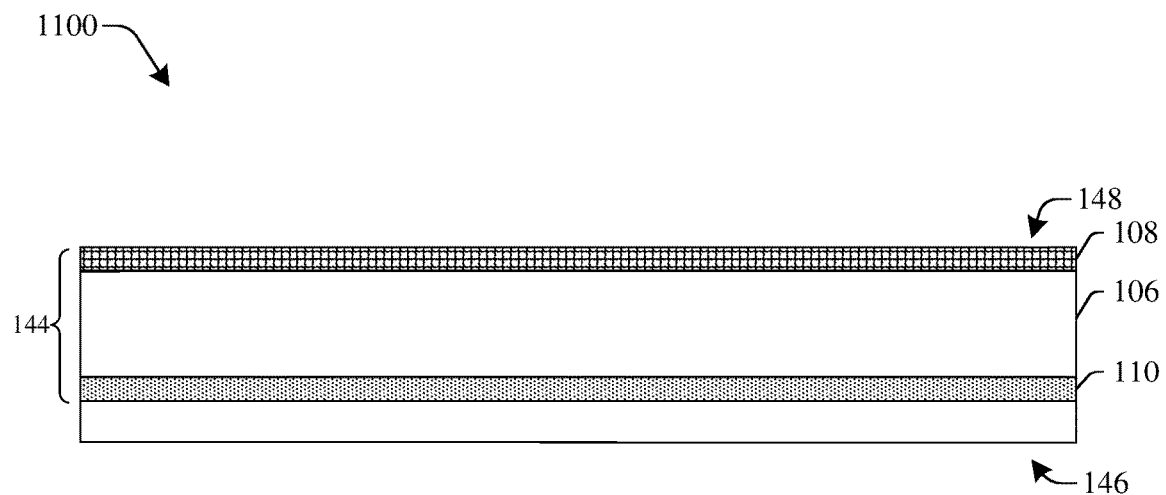
Figure 12:
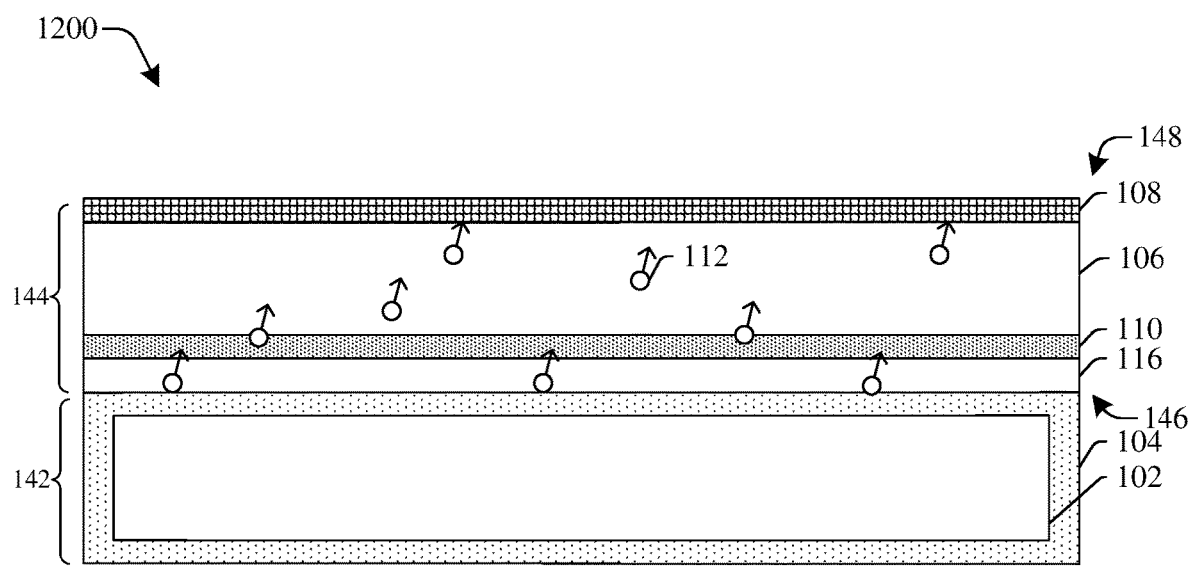

FIGS. 11-12 are cross-sectional views 1100-1200 showing some alternative embodiments of a method of manufacturing a SOI structure that uses an impurity competing layer for getting contamination particles. The embodiments shown by FIGS. 11-12 may have similar processing steps as shown by FIGS. 4-10, except that instead of forming the impurity competing layer 108 within the dummy substrate 106 as shown in FIG. 5, the impurity competing layer 108 may be formed on a back side 148 of the dummy substrate 106, as shown by FIG. 11. The impurity competing layer 108 can be formed by a deposition process, such as, a chemical vapor deposition process (CVD), a physical vapor deposition process (PVD), or an atomic layer deposition process (ALD). The impurity competing layer 108 can be formed by a backside sandblasting process or a gettering dry polishing process to the dummy substrate 106. The impurity competing layer 108 can be or comprises a monocrystalline silicon layer, a polysilicon layer or a silicon oxynitride layer. Then during the annealing process, as shown by FIG. 12, the impurity competing layer 108 absorbs the potential contamination particles 112 from an interface area between the carrier wafer 142 and the dummy wafer 144 towards the impurity competing layer 108, as illustrated by the arrows connected to the particles 112. Thus, the potential contamination particles 112 are removed from a top portion of the dummy substrate 106 close to the insulation layer 104. The annealing process may be integrated with a bonding annealing process and strengthen the bonding of the dummy wafer 144 and the carrier wafer 142. Then, similar as shown and previously described associated with FIGS. 9 and 10, a portion of the dummy substrate 106 is removed from the dummy wafer 144, leaving a remaining portion of the dummy substrate 106 defines a device layer 116 of the carrier wafer 142. Though the hydrogen-rich region 110 is shown in some figures of the embodiments illustrated in FIGS. 4-12, it is appreciated that alternative manufacturing methods to separate the dummy wafer 144 and the carrier wafer 142 can be incorporated in these embodiments with absence of the hydrogen-rich region 110. For example, a separation method illustrated associated with FIGS. 18 and 24 below can be incorporated by the embodiments illustrated in FIGS. 4-12.

FIGS. 13-18 are cross-sectional views 1300-1800 showing a method of manufacturing a SOI structure that uses an impurity competing layer for getting contamination particles in accordance with some alternative embodiments.

Figure 13:
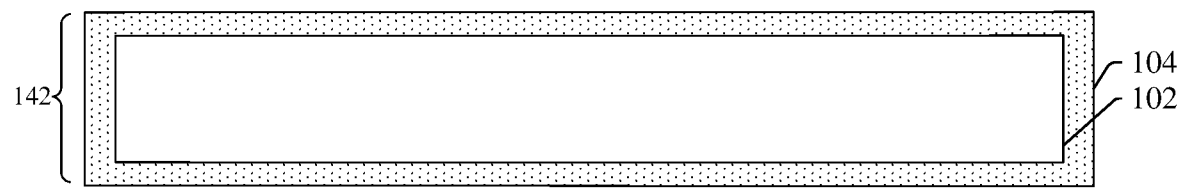

As shown in a cross-sectional view 1300 of FIG. 13, a carrier wafer 142 is provided. The carrier wafer 142 includes a support substrate 102. An insulation layer 104 is formed on the support substrate 102. In some embodiments, the support substrate 102 is or comprises monocrystalline silicon, some other silicon material, some other semiconductor material, glass, silicon dioxide, aluminium oxide, or any combination thereof. In some embodiments, the support substrate 102 has a circular top layout and/or has a diameter of about 200, 300, or 450 millimeters. In other embodiments, the support substrate 102 has some other shape and/or some other dimensions. In some embodiments, the support substrate 102 is doped with p-type or n-type dopants. The p-type doping concentration of the support substrate 102 may be in a range of from about $10^{14}$ $cm^{-3}$ to about $10^{16}$ $cm^{-3}$. In some embodiments, the insulation layer 104 can be formed by performing a thermal process to the support substrate 102 to form a thermal oxide layer. In other embodiments, the insulation layer 104 can be formed by a deposition process, such as, a chemical vapor deposition process (CVD), a physical vapor deposition process (PVD), or an atomic layer deposition process (ALD). The insulation layer 104 may be formed covering outer surfaces of the support substrate 102.

Figure 14:
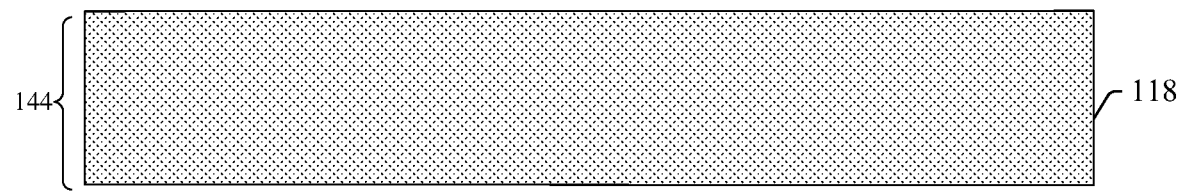

As shown in a cross-sectional view 1400 of FIG. 14, a dummy wafer 144 is provided. The dummy wafer 144 includes a dummy substrate 118. In some embodiments, the dummy substrate 118 is or comprises monocrystalline silicon, some other silicon material, some other semiconductor material, or any combination of the foregoing. In some embodiments, the dummy substrate 118 is doped with p-type or n-type dopants and/or has a low resistivity. As an example, the dummy substrate 118 can be a p-type doped silicon with a doping concentration greater than $10^{17}$ $cm^{-3}$. The resistance of the dummy substrate 118 may, for example, be controlled by a doping concentration of the dummy substrate 118. The resistance of the dummy substrate 118 may, for example, be less than about 0.01 or 0.02 Ω/cm and/or may, for example, be about 0.01-0.2 Ω/cm. In some embodiments, the dummy substrate 118 has lower doping concentration and resistance than the support substrate 102. In some embodiments, the dummy substrate 118 has a circular top layout and/or has a diameter of about 200, 300, or 450 millimeters. In other embodiments, the dummy substrate 118 has some other shape and/or some other dimensions. In some embodiments, the dummy substrate 118 is a bulk semiconductor substrate and/or is a semiconductor wafer. In some embodiments, a thickness of the dummy substrate 118 is about 720-780 micrometers, about 720-750 micrometers, or about 750-780 micrometers. In some embodiments, the thickness of the dummy substrate 118 is the same or about the same as the thickness of the support substrate 102.

Figure 15:
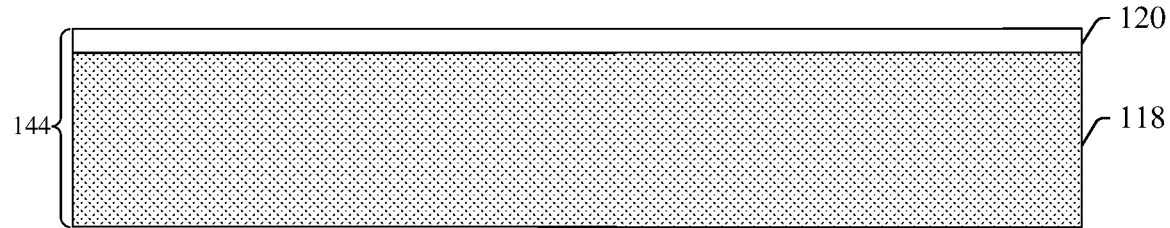

As shown in the cross-sectional view 1500 of FIG. 15, a device layer 120 is formed on the dummy substrate 118. The device layer 120 may be, or comprise a semiconductor material such as silicon. The device layer 120 may be formed by an epitaxial deposition process, such as, a chemical vapor deposition process (CVD), a physical vapor deposition process (PVD), or an atomic layer deposition process (ALD). For example, the device layer 120 may be a p-type doped epitaxial silicon layer on the dummy substrate 118 with a doping concentration in a range of from about $10^{14}$ cm$^{-3}$ to about $10^{16}$ cm$^{-3}$.

Figure 16:
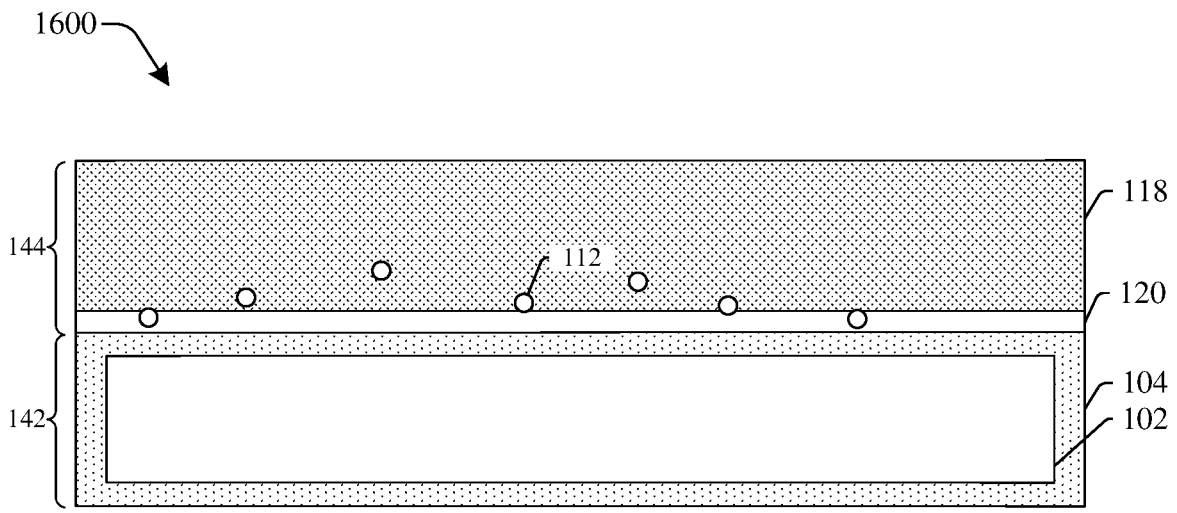

As shown in the cross-sectional view 1600 of FIG. 16, the dummy wafer 144 is bonded to the carrier wafer 142. The bonding presses the dummy wafer 144 and the carrier wafer 142 together and forms a bond interface at which the insulation layer 104 and the device layer 120 directly contact. The bonding may, for example, be performed by fusion bonding, vacuum bonding, or some other bonding process. The bonding process may also gather some potential metal contaminations (shown by particles 112 for illustration purposes) to an interface between the carrier wafer 142 and the dummy wafer 144.

Figure 17:
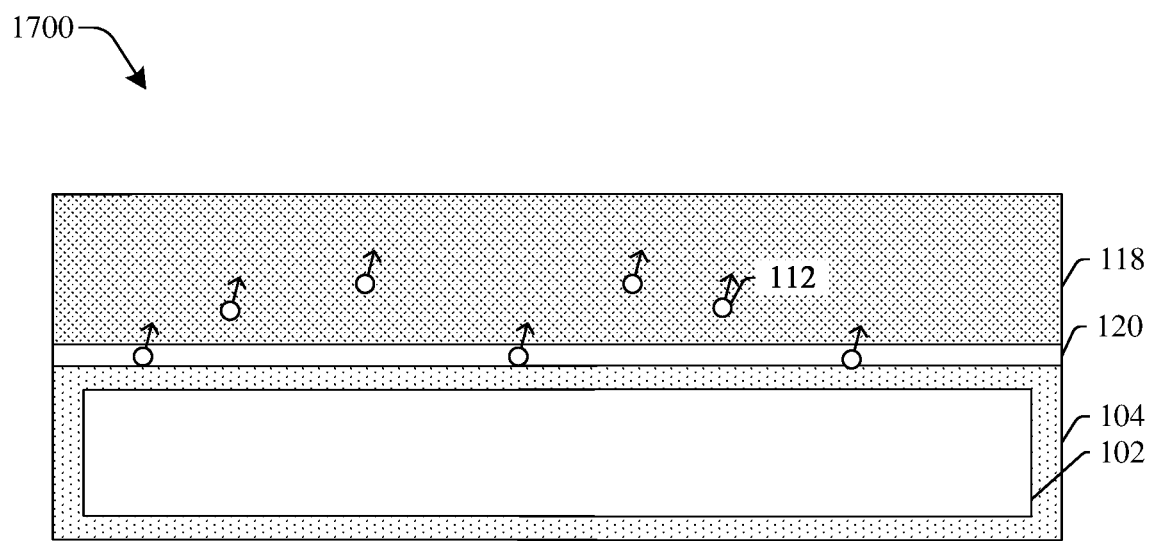

As shown in the cross-sectional view 1700 of FIG. 17, an annealing process is performed. During the annealing process, the highly doped dummy substrate 118 functions as a thick impurity competing body and absorbs the potential contamination particles 112 from the device layer 120 and the interface between the carrier wafer 142 and the dummy wafer 144 towards the impurity competing layer 108, as illustrated by the arrows connected to the particles 112. Thus, the potential contamination particles 112 are removed from the device layer 120 and the interface between the carrier wafer 142 and the dummy wafer 144. The annealing process may be integrated with a bonding annealing process and strengthen the bonding of the dummy wafer 144 and the carrier wafer 142.

Figure 18:
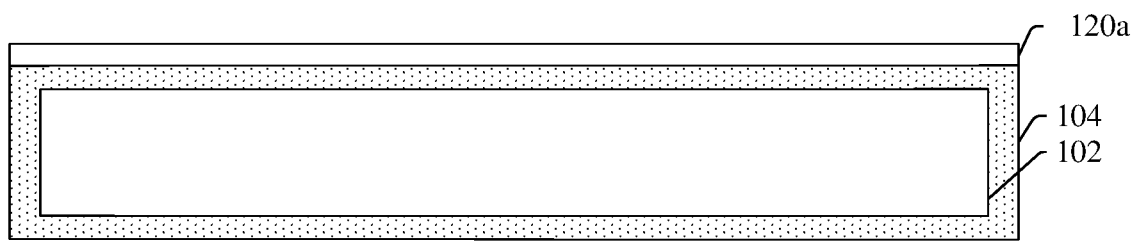

As shown in the cross-sectional view 1800 of FIG. 18, a thinning process is performed into the dummy wafer 144. The thinning process removes a major portion of the dummy wafer 144 which may include the whole dummy substrate 118 and a portion of the device layer 120. In some embodiments, the thinning process is performed into the dummy wafer 144 including the device layer 120 until leaving a top portion 120a of the device layer 120 having a predetermined thickness. The predetermined thickness may, for example, about 20-45 micrometers, about 20-32.5 micrometers, or about 32.5-45 micrometers. The thinning process may include a grinding process, a chemical-mechanical polishing process, and wet etching processes such as HNA (hydrofluoric, nitric, acetic) and TMAH (tetramethylammonium hydroxide).

FIGS. 19-24 are cross-sectional views 1900-2400 showing a method of manufacturing a SOI structure that uses an impurity competing layer for getting contamination particles in accordance with some alternative embodiments.

Figure 19:
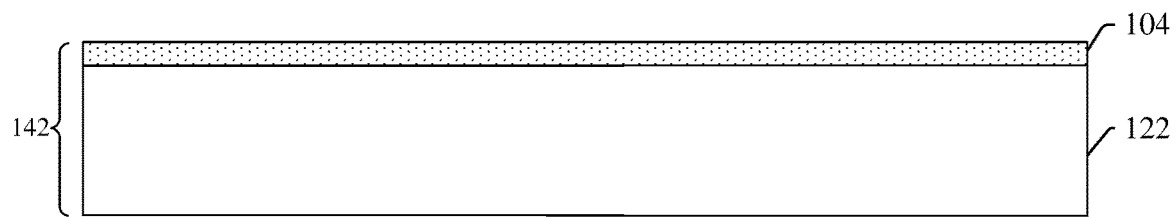

As shown in a cross-sectional view 1900 of FIG. 19, a carrier wafer 142 is provided. The carrier wafer 142 includes a support substrate 122. An insulation layer 104 is formed on the support substrate 122. In some embodiments, the support substrate 122 is or comprises monocrystalline silicon, some other silicon material, some other semiconductor material, glass, silicon dioxide, aluminium oxide, or any combination thereof. In some embodiments, the support substrate 122 has a circular top layout and/or has a diameter of about 200, 300, or 450 millimeters. In other embodiments, the support substrate 122 has some other shape and/or some other dimensions. In some embodiments, the support substrate 122 is doped with p-type or n-type dopants. The p-type doping concentration of the support substrate 122 may be in a range of from about $10^{14}$ cm$^{-3}$ to about $10^{16}$ cm$^{-3}$. In some embodiments, the insulation layer 104 can be formed by a deposition process, such as, a chemical vapor deposition process (CVD), a physical vapor deposition process (PVD), or an atomic layer deposition process (ALD). The insulation layer 104 may be formed on a top surface of the support substrate 122. Side and bottom surfaces of the support substrate 122 may be absent of the insulation layer 104.

Figure 20:
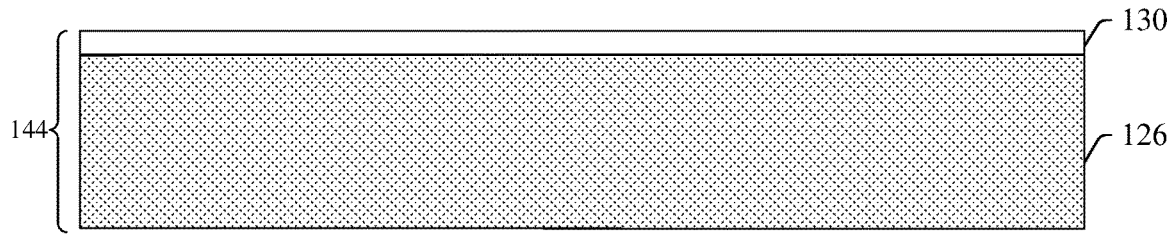

As shown in a cross-sectional view 2000 of FIG. 20, a dummy wafer 144 is provided. The dummy wafer 144 includes a dummy substrate 126. In some embodiments, the dummy substrate 126 is or comprises monocrystalline silicon, some other silicon material, some other semiconductor material, or any combination of the foregoing. In some embodiments, the dummy substrate 126 is doped with p-type or n-type dopants and/or has a low resistivity. As an example, the dummy substrate 126 can be a p-type doped silicon with a doping concentration greater than $10^{17}$ cm$^{-3}$.

Also shown in the cross-sectional view 2000 of FIG. 20, a lower device layer 130 is formed on the dummy substrate 126. The lower device layer 130 may be, or comprise a semiconductor material such as silicon. The lower device layer 130 may be formed by an epitaxial deposition process, such as, a chemical vapor deposition process (CVD), a physical vapor deposition process (PVD), or an atomic layer deposition process (ALD). For example, the lower device layer 130 may be a p-type doped epitaxial silicon layer on the dummy substrate 126 with a doping concentration in a range of from about $10^{14}$ cm$^{-3}$ to about $10^{16}$ cm$^{-3}$.

Figure 21:
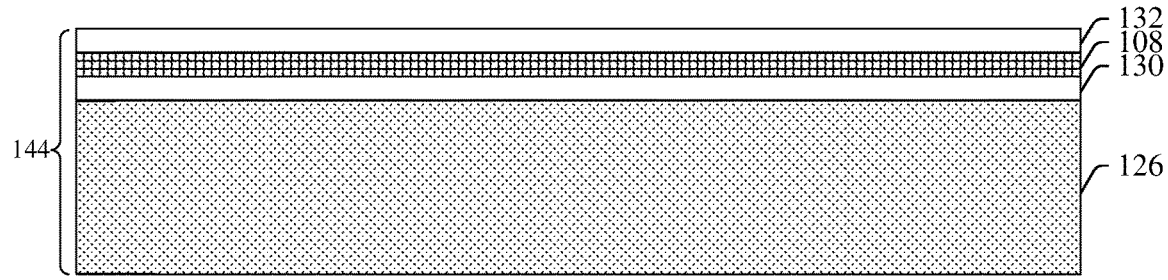

Also shown in the cross-sectional view 2100 of FIG. 21, an impurity competing layer 108 is formed in the dummy substrate 126. In some embodiments, the impurity competing layer 108 may be formed by depositing an epitaxial layer on the lower device layer 130. The impurity competing layer 108 may be, or comprise silicon, germanium or other semiconductor material with doping of boron, carbon or other dopants as a gettering source. For example, the impurity competing layer 108 may be, or comprise epitaxial silicon germanium layer with doping of boron and carbon. An upper device layer 132 may be subsequently formed on the impurity competing layer 108. The upper device layer 132 may be, or comprise a semiconductor material such as silicon. The upper device layer 132 may be formed by an epitaxial deposition process, such as, a chemical vapor deposition process (CVD), a physical vapor deposition process (PVD), or an atomic layer deposition process (ALD). For example, the upper device layer 132 may be a p-type doped epitaxial silicon layer on the dummy substrate 126 with a doping concentration in a range of from about $10^{14}$ cm$^{-3}$ to about $10^{16}$ cm$^{-3}$.

Figure 22:
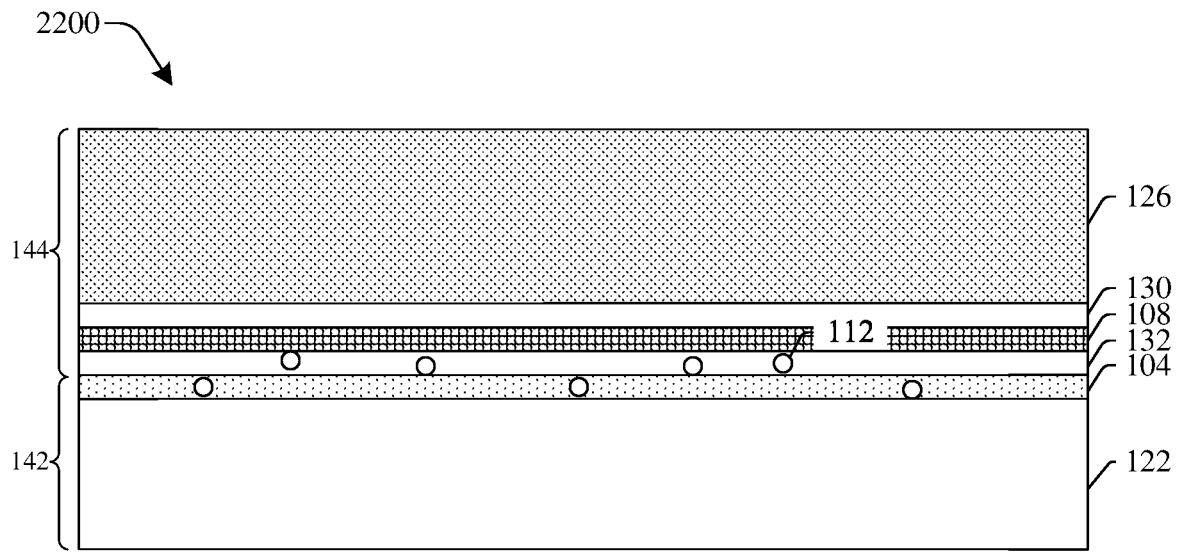

As shown in the cross-sectional view 2200 of FIG. 22, the dummy wafer 144 is bonded to the carrier wafer 142. The bonding presses the dummy wafer 144 and the carrier wafer 142 together and forms a bond interface at which the insulation layer 104 and the upper device layer 132 directly contact. The bonding may, for example, be performed by fusion bonding, vacuum bonding, or some other bonding process. The bonding process may also gather some potential metal contaminations (shown by particles 112 for illustration purposes) to an interface between the carrier wafer 142 and the dummy wafer 144.

Figure 23:
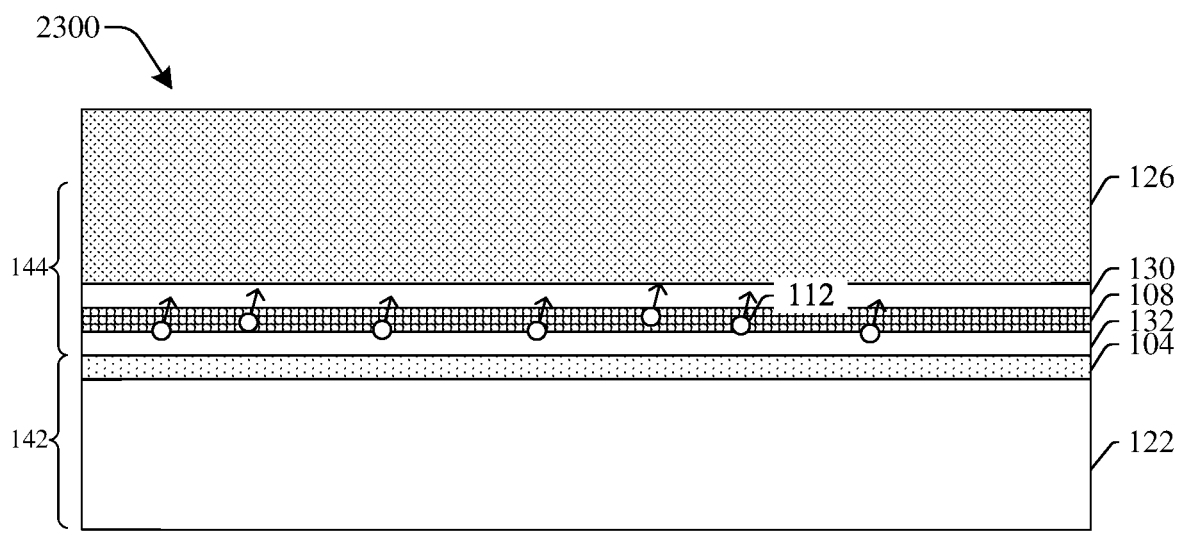

As shown in the cross-sectional view 2300 of FIG. 23, an annealing process is performed. During the annealing process, the impurity competing layer 108 and the highly doped dummy substrate 126 functioning as a thick impurity competing body absorb the potential contamination particles 112 from the interface between the carrier wafer 142 and the dummy wafer 144 towards the impurity competing layer 108, as illustrated by the arrows connected to the particles 112. Thus, the potential contamination particles 112 are removed from the interface between the carrier wafer 142 and the dummy wafer 144. The annealing process may be integrated with a bonding annealing process and strengthen the bonding of the dummy wafer 144 and the carrier wafer 142.

Figure 24:
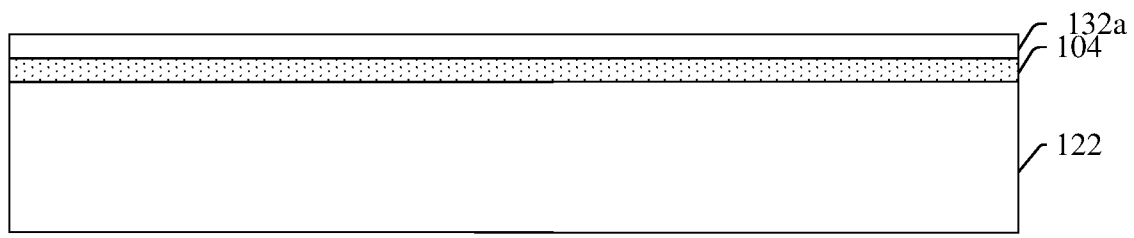

As shown in the cross-sectional view 2400 of FIG. 24, a thinning process is performed into the dummy wafer 144. The thinning process removes a major portion of the dummy wafer 144 which may include the dummy substrate 126, the lower device layer 130, the impurity competing layer 108, and a portion of the upper device layer 132, and leaves a top portion 132a of the upper device layer 132 having a predetermined thickness. The predetermined thickness may, for example, about 20-45 micrometers, about 20-32.5 micrometers, or about 32.5-45 micrometers. In some embodiments, the thinning process is performed by a plurality of etching steps, which may include a first etching step stopping on the impurity competing layer 108, a second etching step removing the impurity competing layer 108 and stopping on the upper device layer 132, and a third etching step performed to the upper device layer 132 with a more precise etching control. As an example, a first etchant for the first etching step may include TMAH and may have an etching rate ratio of the lower device layer 130 relative to the impurity competing layer 108 greater than 100. A second etchant for the second etching step may include hydrofluoric acid or nitric acid and may have an etching rate ratio of the impurity competing layer 108 relative to the upper device layer 132 at least greater than 7.

Figure 25:
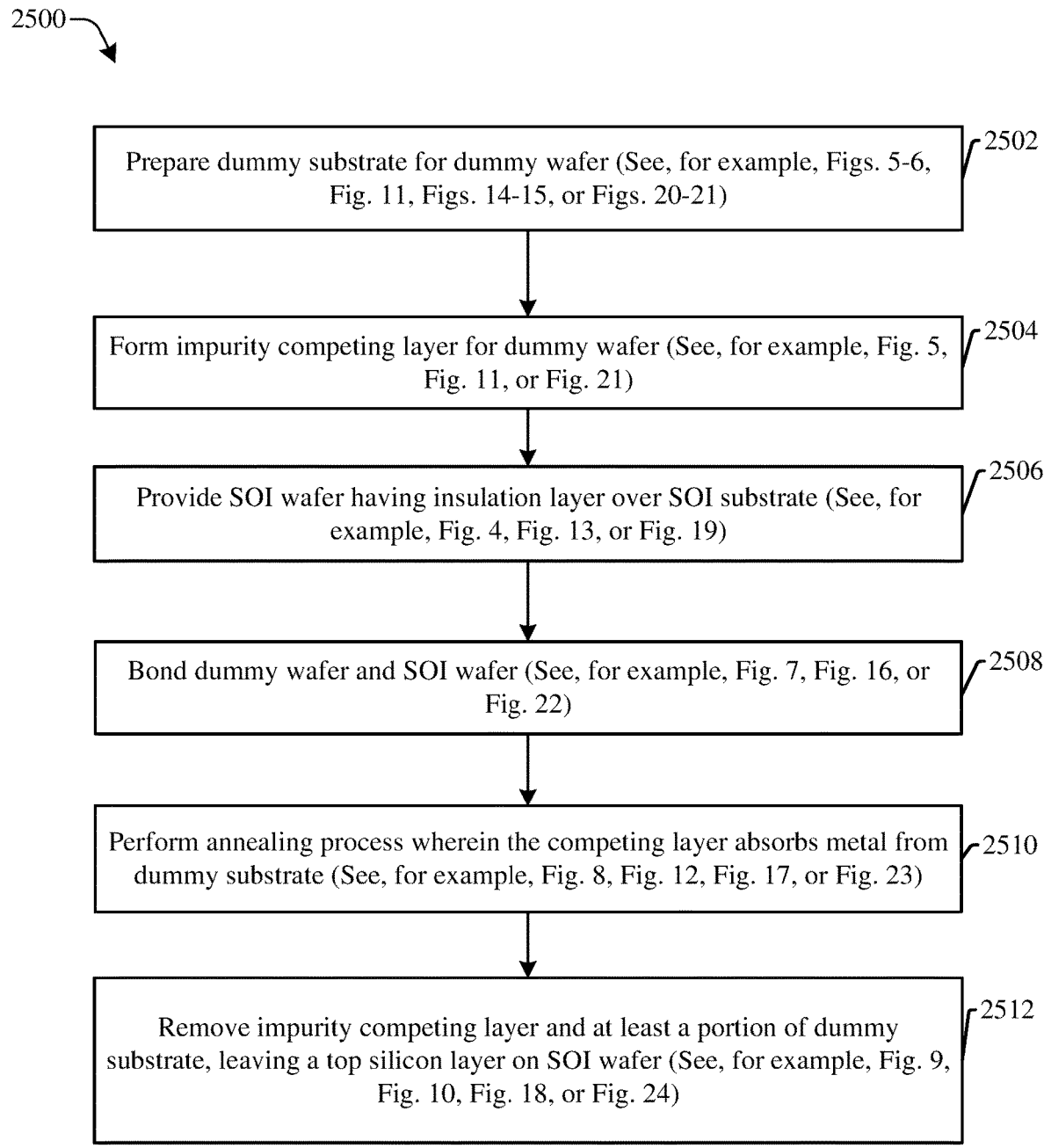
FIG. 25 illustrates a flow diagram of a method for manufacturing a SOI structure in accordance with some embodiments.

FIG. 25 illustrates a flow diagram of a method for manufacturing a SOI structure in accordance with some embodiments. The SOI structure includes the impurity competing layer formed in a dummy wafer to provide contaminating metal gettering. Example methods of forming the SOI structure are shown in FIGS. 4-10, 11-12, 13-18, and 19-24. Although FIGS. 4-10, 11-12, 13-18, and 19-24 are described in relation to the method shown in FIG. 25, it will be appreciated that the structures disclosed in FIGS. 4-10, 11-12, 13-18, and 19-24 are not limited to the method shown in FIG. 25, but instead may stand alone as structures independent of the method shown in FIG. 25. Similarly, although the method shown in FIG. 25 is described in relation to FIGS. 4-10, 11-12, 13-18, and 19-24, it will be appreciated that the method shown in FIG. 25 is not limited to the structures disclosed in FIGS. 4-10, 11-12, 13-18, and 19-24, but instead may stand alone independent of the structures disclosed in FIGS. 4-10, 11-12, 13-18, and 19-24. Also, while disclosed methods (e.g., the method shown in FIG. 25) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2502, a dummy substrate is prepared for a dummy wafer. See, for example, as shown by a cross-sectional view shown in FIGS. 5-6, FIG. 11, FIGS. 14-15, or FIGS. 20-21.

At act 2504, an impurity competing layer is formed for the dummy wafer. See, for example, as shown by a cross-sectional view shown in FIG. 5, FIG. 11, or FIG. 21.

At act 2506, a carrier wafer is provided having an insulation layer over a support substrate. See, for example, as shown by a cross-sectional view shown in FIG. 4, FIG. 13, or FIG. 19.

At act 2508, a dummy wafer and carrier wafer are bonded. See, for example, as shown by a cross-sectional view shown in FIG. 7, FIG. 16, or FIG. 22.

At act 2510, an annealing process is performed. During the annealing process, the impurity competing layer absorbs metal from dummy substrate. See, for example, as shown by a cross-sectional view shown in FIG. 8, FIG. 12, FIG. 17, or FIG. 23.

At act 2512, the impurity competing layer and at least a portion of the dummy substrate are removed, leaving a device layer on the carrier wafer. See, for example, as shown by a cross-sectional view shown in FIG. 9, FIG. 10, FIG. 18, or FIG. 24.

Thus, as can be appreciated from above, the present disclosure relates to a SOI structure and associated methods. An impurity competing layer or body is formed and used during an annealing process to absorb metal particles and reduce contamination for the semiconductor layer of the SOI structure. The impurity competing layer locates at a position within or on a backside of the dummy wafer and may comprise doped semiconductor material with a gettering source.

In some embodiments, the present disclosure relates a method of forming a SOI structure. The method comprises preparing a dummy substrate for a dummy wafer and forming an impurity competing layer on the dummy substrate. The method further comprises providing a carrier wafer including an insulation layer over a support substrate and bonding a front side of the dummy wafer to the carrier wafer. The method further comprises performing an annealing process wherein the impurity competing layer absorbs metal from an upper portion of the dummy substrate. The method further comprises removing a majority portion of the dummy substrate including the impurity competing layer, leaving a device layer of the dummy substrate on the insulation layer of the carrier wafer.

In other embodiments, the present disclosure relates to a method of forming a SOI structure. The method comprises preparing a dummy substrate for a dummy wafer and forming an impurity competing layer on a back side of the dummy wafer. The method further comprises providing a carrier wafer comprising an insulation layer over a support substrate and bonding a front side of the dummy wafer to the carrier wafer. The method further comprises performing an annealing process. The impurity competing layer absorbs metal from an upper portion of the dummy substrate. The method further comprises removing the impurity competing layer and a majority portion of the dummy substrate, leaving a device layer of the dummy substrate on the insulation layer of the carrier wafer.

In yet other embodiments, the present disclosure relates to a method of forming a SOI structure. The method comprises preparing a dummy substrate for a dummy wafer and forming an impurity competing layer on the dummy substrate. The method further comprises forming a device layer on the impurity competing layer and providing a carrier wafer comprising a insulation layer over a support substrate. The method further comprises bonding a front side of the dummy wafer to the carrier wafer. The method further comprises performing an annealing process wherein the dummy substrate absorbs metal from the device layer. The method further comprises performing a thinning process to remove the dummy substrate and leaving at least a portion of the device layer on the insulation layer of the carrier wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a SOI structure, the method comprising:
   preparing a dummy substrate for a dummy wafer;
   forming an impurity competing layer within the dummy substrate, extending from a first surface of the dummy substrate to a second surface of the dummy substrate opposite the first surface;
   depositing a device layer directly onto the impurity competing layer at the first surface of the dummy substrate;
   forming an insulation layer over a support substrate;
   bonding the device layer of the dummy wafer to the insulation layer;
   performing an annealing process wherein the dummy substrate absorbs metal from the device layer; and
   performing a thinning process to remove the dummy substrate and leaving the device layer on the insulation layer.

2. The method of claim 1, wherein the impurity competing layer is a p-type doped silicon with a doping concentration greater than $10^{17}$ cm$^{-3}$.

3. The method of claim 1, wherein the impurity competing layer is formed by implanting p-type dopants throughout the dummy substrate.

4. The method of claim 1, wherein the device layer is a p-type doped silicon with a doping concentration less than a doping concentration of the impurity competing layer.

5. The method of claim 1, wherein the impurity competing layer is formed to have a thickness in a range of from about 720 micrometers to 780 micrometers.

6. The method of claim 1, wherein after the device layer is deposited, the device layer directly contacts the impurity competing layer.

7. A method of forming a SOI structure, the method comprising:
   preparing a dummy substrate for a dummy wafer;
   doping the dummy substrate to form an impurity competing layer extending from a first surface to a second surface of the dummy substrate and to outer sidewalls oblique or perpendicular to the first surface of the dummy substrate;
   depositing a device layer on the impurity competing layer, wherein the device layer is deposited onto the first surface of the dummy substrate and directly contacts the impurity competing layer;
   forming an insulation layer over a support substrate;
   bonding the device layer to the insulation layer;
   performing an annealing process wherein the impurity competing layer absorbs metal from the device layer; and
   removing a major portion of the dummy wafer including the dummy substrate and the impurity competing layer and leaving a remaining portion of the device layer on the insulation layer.

8. The method of claim 7, wherein the impurity competing layer is a p-type doped silicon with a doping concentration greater than $10^{17}$ cm$^{-3}$.

9. The method of claim 7, wherein the support substrate comprises aluminum oxide.

10. The method of claim 7, wherein the impurity competing layer does not extend past a surface of the dummy substrate.

11. The method of claim 7, wherein the device layer is formed by forming a p-type doped epitaxial silicon layer on the impurity competing layer with a doping concentration in a range of from about $10^{14}$ cm$^{-3}$ to about $10^{16}$ cm$^{-3}$.

12. The method of claim 7, wherein the forming of the insulation layer comprises performing a thermal process to the support substrate to form a thermal oxide layer.

13. The method of claim 7, wherein the removing of the major portion of the dummy wafer comprises a thinning process comprising one or more of a grinding process, a chemical-mechanical polishing process, or a wet etching process.

14. The method of claim 7, wherein the device layer is deposited on the impurity competing layer using an epitaxial deposition process.

15. The method of claim 7, wherein the support substrate comprises a p-type doped silicon layer with a doping concentration in a range of from about $10^{14}$ cm$^{-3}$ to $10^{16}$ cm$^{-3}$.

16. The method of claim 13, wherein the thinning process leaves the remaining portion of the device layer having a thickness between 20 and 45 micrometers.

17. A method of forming a SOI structure, the method comprising:
   preparing a dummy substrate for a dummy wafer, the dummy substrate having a first surface, a second surface opposite the first surface, and an outer sidewall extending between the first surface and the second surface;
   forming an impurity competing layer within the dummy substrate, the impurity competing layer extending from the first surface to the second surface of the dummy substrate, and further extending to the outer sidewall of the dummy substrate;
   forming a device layer on the impurity competing layer and covering the first surface of the dummy substrate, the device layer comprising a back side contacting the first surface of the dummy substrate and a front side opposite the back side and extending over the first surface of the dummy substrate;
   bonding the front side of the device layer to an insulation layer of a support substrate;
   performing an annealing process, wherein the impurity competing layer absorbs metal from the device layer; and removing a major portion of the dummy wafer, leaving a remaining portion of the device layer on the insulation layer.

18. The method of claim 17, wherein the impurity competing layer is formed by an implantation process, and the implantation process results in the dummy substrate comprising p-type silicon with a doping concentration greater than $10^{17}$ cm$^{-3}$.

19. The method of claim 17, wherein the dummy substrate has a circular top layout, and the outer sidewall forms a continuous loop around the first surface and the second surface.

20. The method of claim 17, wherein the support substrate has p-type doping with a concentration in a range of from $10^{14}$ cm$^{-3}$ to $10^{16}$ cm$^{-3}$.

* * * * *